United States Patent [19]

Moon

[11] Patent Number: 4,763,018

[45] Date of Patent: Aug. 9, 1988

[54] TRANSISTOR CONSTANT BIAS CIRCUITS

[75] Inventor: Philip A. K. Moon, Wiltshire, England

[73] Assignee: Plessey Overseas Limited, Ilford, England

[21] Appl. No.: 11,098

[22] Filed: Feb. 5, 1987

[30] Foreign Application Priority Data

Feb. 7, 1986 [GB] United Kingdom ................. 8603112

[51] Int. Cl.[4] .......................... H03K 3/01; H03G 3/10

[52] U.S. Cl. ................................ 307/296 R; 307/255; 307/310; 330/285

[58] Field of Search .................... 307/296 R, 310, 255; 330/261, 259, 266, 289, 285

[56] References Cited

U.S. PATENT DOCUMENTS 3,939,434 2/1976 Crosby ................................ 307/297
3,955,108 4/1976 Beck .................................... 307/310
4,016,435 5/1977 Voorman ............................ 307/297
4,029,974 6/1977 Brokaw .............................. 307/310

*Primary Examiner*—Stanley D. Miller
*Assistant Examiner*—B. P. Davis
*Attorney, Agent, or Firm*—Michael F. Oglo; Julian C. Renfro

[57] ABSTRACT

A circuit (FIG. 4) in which a sub-circuit comprised of a bias transistor (T1), a feedback reisistor (R2) connected between the collector of this transistor (T1) and its base, and, a drive transistor (T2), is connected to its polarity-inverse sub-circuit (T1', R2', T2') in a ring configuration and is initiated by means of current injection from a start-up bias circuit. The latter may comprise a bias transistor (T1"), a drive transistor (T2") the base of which is connected to the collector of the bias transistor (T1"), and a pair of feedback current/voltage divider resistors (R1", R2") in the collector path of the bias transistor (T1"). Following start-up, constant current is maintained by feedback in the ring, and this current may be tapped at an appropriate point in the ring.

3 Claims, 2 Drawing Sheets

TRANSISTOR CONSTANT BIAS CIRCUITS

TECHNICAL FIELD

The present invention concerns improvements in or relating to bias circuits, notably circuits that will provide constant bias current and will operate from a low supply voltage—e.g. a supply voltage of the order 0.9 volts.

BACKGROUND ART

When designing circuits, the need often arises to generate a supply-independent current bias. A known design of bias circuit is shown in FIG. 1. The arrangement is that described in United Kingdom Patent Application GB No. 2007055. The circuit shown comprises a bias transistor T1, the collector load of which includes a pair of resistors R1, R2, which latter serve as a voltage/current divider. Feedback voltage/current is taken from the junction of the pair of resistors R1, R2 and is applied to the base of the bias transistor T1. The voltage/current, at the collector output of the bias transistor T1, is referred to the base of a drive transistor T2.

The first resistor R1 is connected to the supply voltage rail Vs, and the emitters of the two transistors T1, T2, both NPN type bipolar transistors, are connected to circuit earth. The drive transistor T2 serves thus as a current sink. This bias circuit has a peaked current versus supply voltage characteristic, the characteristic C1 shown in FIG. 3. For practical purposes this bias circuit thus provides current that is reasonably constant over a limited range of supply voltage in the region of the characteristic maximum. The resistor values are chosen so that the range of supply voltage matches the working range of the circuit application, but because of the peaked nature of the characteristic the working range is necessarily much restricted, and applications therefore severely limited. The current value may be scaled by appropriate choice of the ratio of transistor emitter areas.

The PNP inverse of the above circuit is also known, and may be employed as a current source.

To provide current constancy over a wider range of supply voltage, it is also known to cascade the NPN bias circuit and its PNP inverse as shown in FIG. 2. See also the article entitled "Optimum Design of Two Cascaded Peaking Current Sources" by V. Gheorgiu et al., IEEE Journal of Solid-State Circuits, Vol SC-16 No. 4 August 1981 pages 415–417, in which cascading is described. The circuit of figure comprises a PNP bias circuit including a bias transistor T1′, a pair of collector load and base feedback resistors R1′, R2′ and a drive transistor T2′. This circuit is cascaded to the NPN circuit of FIG. 1 just described, the drive transistor T2′ replacing the first resistor R1. This circuit has a twin-peaked characteristic—characteristic C2 shown in FIG. 3. Although this has an improved response, the peaking can be most pronounced when the circuit is overcompensated, and great care therefore must be taken in selecting the circuit components.

DISCLOSURE OF THE INVENTION

The present invention is intended to provide a bias circuit capable of operation at low supply voltage—e.g. a supply voltage of the order 0.9 volts—and of supplying bias current reasonably constant in value independent of supply voltage and transistor parameters.

According to the present invention thus there is provided a bias circuit comprising:

an NPN type bipolar bias transistor;

a resistor, in the collector path of the bias transistor, connected to apply feedback to the base of the bias transistor; and, an NPN-type bipolar drive transistor, the base of which is connected to the collector of the bias transistor;

Characterised by:

the PNP-type inverse of the aforesaid transistor-resistor-transistor circuit connected therewith in a ring configuration; and, a start-up current bias circuit connected to a point in the ring configuration.

In the circuit aforesaid, once current flow is established by the start-up circuit, current constancy is maintained by feedback in the ring. The output current may be taken from any suitable point in the ring.

It is convenient to adopt as start-up circuit, a circuit comprising: a bias transistor; a pair of resistors, in the collector path of the bias transistor, and connected to apply feedback to the base of the bias transistor; and, a drive transistor, the base of which is connected to the collector of the start-up bias transistor, the collector of which is connected to the point in the ring configuration. The start-up transistors may be NPN-type, for example, and may be connected thus to the collector of the NPN drive transistor of the bias circuit.

BRIEF INTRODUCTION OF THE DRAWINGS

In the drawings accompanying this specification:

DESCRIPTION OF PREFERRED EMBODIMENT

So that this invention may be better understood, an embodiment thereof will now be described and particular reference will be made to FIG. 4 of the drawings. The description that follows is given by way of example only.

Figure 1:
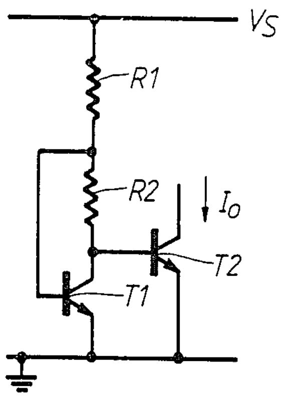
FIG. 1. PRIOR ART
FIGS. 1 and 2 are circuit diagrams for two known types of bias circuit.
Figure 2:
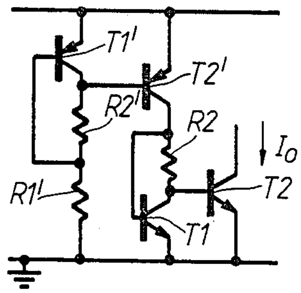
FIG. 2. PRIOR ART
Figure 3:
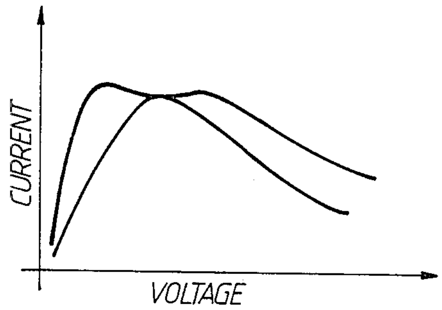
FIG. 3 is a graph showing the current-voltage characteristics of the two circuits shown in the preceding FIGS. 1 and 2; and, FIG. 4 is a circuit diagram for a bias circuit modified in accord with this invention.
Figure 4:
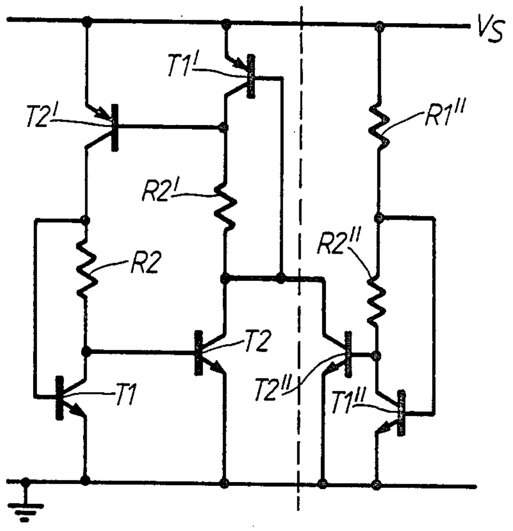

In the circuit shown FIG. 4 a first bias transistor T1 has a feedback resistor R2 in its collector path, and the base of a first drive transistor T2 is connected to the collector output of the first bias transistor T1. Both these transistors are of NPN bipolar type and the end of the resistor R2 furthest from the collector is connected to the base of the first bias transistor to provide feedback. These components, which together form a first peaking current bias sub-circuit, are combined with a second peaking current bias sub-circuit, the PNP inverse of the first. This latter thus comprises a pair of PNP-type bipolar transistors, namely a second bias transistor T1′ and a second drive transistor T2′, the base of the latter T2′ being connected to the collector output of the former T1′ and a second resistor R2′ being included in the collector path of the second bias transistor T1′ and connected to the base of this transistor for feedback. The two peaking current bias sub-circuits are connected together in a ring configuration, the drive transistors T2, T2′, in each case, being connected in the collector path of the bias transistors T1′, T1, respectively, of the other sub-circuit. The combination thus far described will reject variation in supply voltage. However, initially, no transistor will be conducting and it is necessary to inject or extract current to initiate operation. Any suitable start-up circuit may be used for this purpose. It is convenient however to use a peaking current bias circuit of a somewhat similar construction to the first mentioned sub-circuit, this start-up circuit comprising a third bias transistor T1″ and a third drive transistor T2″ the base of which is connected to the collector of the third bias transistor T1″ and the collector of which is connected to a point in the ring configuration—eg. to the collector of the first drive transistor T2, as shown. The collector path of the third transistor T1″ includes a pair of third resistors R1″, R2″ which are connected in series between the collector and the supply rail Vs. Feedback is taken from the junction of these two resistors R1″, R2″ and applied to the base of the third bias transistor T1″. A feature of the start-up circuit is that the value of the intermediate resistor R2″ is inordinately high and such therefore that the characteristic of this start-up circuit peaks sharply and at very low supply voltage.

This start-up circuit will thus provide a current peak as the supply voltage increases at start-up and no appreciable current loading thereafter as the supply voltage attains normal operating value. Once current is injected into the ring configuration the sub-circuit transistors each turn on and because of feedback in the ring will thereafter maintain current appreciably constant irrespecitve of subsequent variation in supply voltage and transistor parameters.

Typical component values are presented in the table appearing below:

| | |
|---|---|
| R1″ = 184 ohm; | R2″ = 89K ohm; T1″/T2″ = 1:2 |
| | R2′ = 3K6 ohm; T1′/T2′ = 1:4 |
| | R2 = 1K8 ohm; T1/T2 = 1:1 |

FIELD OF APPLICATION

The intended application for the above described circuits is to integrated circuit design for Radio Paging Receivers. The circuit design for such devices is not straight forward due to low battery voltage requirements (end life 0.9 v) and low current consumption. However, the invention will find application to other low supply, low current circuits.

I claim:

1. A bias-current generator circuit comprising:
an NPN-type bipolar cascaded current amplifier comprised of:
a first power rail;
an NPN-type bipolar bias transistor, having an emitter, a base, and, a collector;
a first collector path conductor connected to the collector of the NPN-type bias transistor;

a first feedback conductor, connected between the first collector path conductor and the base of the NPN-type bias transistor;
a first resistor, inserted in the first collector path conductor, between the collector of the NPN-type bias transistor, and, the first feedback conductor;
an NPN-type bipolar drive transistor, having an emitter, a base, and a collector, the base of which NPN-type bipolar drive transistor is connected to the collector of the NPN-type bipolar bias transistor; and, wherein,
the emitters of the NPN-type bipolar bias and drive transistors are connected to the first power rail;
a PNP-type cascaded current amplifier comprised of:
a second power rail;
a PNP-type bipolar bias transistor, having an emitter, a base, and a collector;
a second collector path conductor connected to the collector of the PNP-type bias transistor;
a second feedback conductor, connected between the second collector path conductor and the base of the PNP-type bias transistor;
a second resistor, inserted in the second collector path conductor, between the collector of the PNP-type bias transistor, and, the second feedback conductor;
an PNP-type bipolar drive transistor, having an emitter, a base, and, a collector, the base of which PNP-type bipolar drive transistor is connected to the collector of the PNP-type bipolar bias transistor; and, wherein,
the emitters of the PNP-type bipolar bias and drive transistors are connected to the second power rail; and, wherein,
the first collector path conductor is connected to the collector of the PNP-type bipolar drive transistor, and, the second collector path conductor is connected to the collector of the NPN-type bipolar drive transistor such that the NPN-type bipolar drive transistor, the second resistor, the PNP-type drive transistor, and the first resistor are connected in a ring, and,
a start-up current bias circuit connected to a point in said ring.

2. A circuit, as claimed in claim 1, wherein the start-up current bias circuit comprises:
a bias transistor; a pair of resistors, in the collector path of the bias transistor, and connected to apply feedback to the base of the bias transistor; and, a drive transistor, the base of which is connected to the collector of the start-up bias transistor, the collector of which is connected to the point in the ring configuration.

3. A circuit, as claimed in claim 2, wherein the bias transistor and the drive transistor of the start-up circuit are both of NPN-type and the collector of the start-up drive transistor is connected to the ring configuration at the collector of the NPN drive transistor thereof.

* * * * *